United States Patent [19]
Temple

[11] Patent Number: 5,260,590
[45] Date of Patent: Nov. 9, 1993

[54] FIELD EFFECT TRANSISTOR CONTROLLED THYRISTOR HAVING IMPROVED TURN-ON CHARACTERISTICS

[75] Inventor: Victor A. K. Temple, Clifton Park, N.Y.

[73] Assignee: Harris Corp., Melborne, Fla.

[21] Appl. No.: 811,999

[22] Filed: Dec. 23, 1991

[51] Int. Cl.⁵ .................... H01L 29/74; H01L 29/78
[52] U.S. Cl. ................... 257/139; 257/153; 257/138; 257/341
[58] Field of Search ............. 357/23.4, 38; 257/153, 257/138, 341, 139

[56] References Cited

U.S. PATENT DOCUMENTS

| | | | |
|---|---|---|---|
| 4,801,986 | 1/1989 | Chang et al. | 357/23.4 |
| 4,965,647 | 10/1990 | Takahashi | 357/23.4 |
| 4,967,244 | 10/1990 | Bauer | 357/23.4 |
| 5,014,102 | 5/1991 | Adler | 357/38 |
| 5,136,349 | 8/1992 | Yilmaz | 357/23.4 |

OTHER PUBLICATIONS

IEEE Trans. Ed. Oct. 1986, Temple, "MOS-Contr. Thyristors . . . " pp. 1609–1618.

*Primary Examiner*—Jerome Jackson

[57] ABSTRACT

A composite thyristor comprising a plurality of parallel connected identical thyristor cells, each of the cells including a turn-on field effect transistor (FET) and a turn-off FET. The gate electrodes of all the FETs form a grid-like pattern on a surface of the semiconductor substrate of the device. The pattern includes strips which intersect at corners. Turn-off FETs are formed along the boundary of the grid and beneath it, and turn-on FETs are disposed beneath the corners.

10 Claims, 3 Drawing Sheets

FIELD EFFECT TRANSISTOR CONTROLLED THYRISTOR HAVING IMPROVED TURN-ON CHARACTERISTICS

BACKGROUND OF THE INVENTION

This invention relates to thyristors of the type including field effect transistors (FETs) for both turning on and turning off the thyristors, and particularly to an improved thyristor having turn-on FETs of increased capacity for more rapidly turning on the thyristors.

FET controlled thyristors, also known as MCTs (Metal-oxide-semiconductor Controlled Thyristors), are now generally known and described, for example, in U.S. Pat. Nos. 4,816,892 and 4,857,977, the subject matter of which is incorporated herein by reference. In such thyristors, turn off is accomplished by diverting current from one of the base regions around (rather than through) the p-n junction formed by the base region and its adjacent emitter region, thereby turning off injection of charge carriers from the emitter into the base. Because generally large current densities are involved, the diverting path length must be relatively short, to prevent high voltage drops therealong, and the thyristors are thus made of a plurality of small cells, each cell being small enough to provide a short current diverting path. The cells are connected in parallel to provide high power capacity in the composite thyristor.

The mechanism for turning off each cell comprises a field effect transistor disposed within each cell at a surface thereof, the channel region of the FETs serving as low resistance switches for creating the current diverting path.

Turning on of such thyristors is accomplished by basically short circuiting a portion of one of the blocking p-n junctions of the thyristor and injecting current from one of the thyristor main terminals directly into one of the base regions for forward biasing the emitter region adjacent thereto. The mechanism for turning on the thyristor also comprises FETs at the substrate surface, the channels of which selectively provide low resistance paths through the blocking p-n junctions.

In order to turn off the thyristor, a relatively large proportion of the current flowing between the device main terminals must be diverted through the channels of the turn-off FETs. Obviously, the channels must be sufficiently low in impedance to carry the current. Conversely, in order to turn on a thyristor, only relatively small amounts of current must be injected into the base region. This is because, once a small portion of an emitter p-n junction is forward biased to inject current into the base region, the process becomes self-sustaining and the initially small turned-on portion of each cell rapidly expands to fully turn on all other portions of the cell and then to neighboring cells until the entire device is fully on.

Because the channels of the turn-on FETs can be smaller than the channels of the turn-off FETs, one practice in the past is to arrange the cells in groups of 9 contiguous cells, i.e., a 3×3 block of cells including a central cell surrounded by 8 cells. This is illustrated in FIG. 1. Each peripheral cell includes a turn-off FET, but only the central cell includes a turn-on FET which is effective for turning on each of the surrounding cells. To avoid reducing the area available for the turn-on FET, the central cell does not include a turn-off FET.

One shortcoming of this arrangement is that the composite thyristor is not of uniform structure or characteristics throughout. This leads to current density variations and problems related thereto.

Another shortcoming of this arrangement is that main terminal current also flows through the central cells when the composite thyristor is in its on or conductive state, and turning off the thyristor also requires turning off the central cells. Because these cells do not have turn-off FETs, however, the currents through the central cells must be diverted to the turn-off FETs of the surrounding cells. This tends to increase the turn-off time and reduce the turn-off capability of the composite thyristor. To counter this effect, one practice is to design at least some of the cells surrounding the central cells with lower main terminal current carrying capacity, thereby reducing the current flow through these surrounding cells and reducing the amount of current that must be diverted therefrom. However, this reduces the overall current capacity of the composite thyristor and is wasteful of space.

In some instances, it is desirable to increase the turn-on speed of the composite thyristor. This can be accomplished by increasing the size or number of the central cells at the expense of the size or number of the surrounding cells, but this causes an undesirable increase in the turn-off time of the thyristor as well as a further reduction in the current carrying capacity of the composite thyristor.

SUMMARY OF THE INVENTION

A composite thyristor comprises a semiconductor substrate including a plurality of identical cells connected in parallel, each of the cells including both turn-on and turn-off FETs disposed at a common surface of the substrate.

DESCRIPTION OF A PREFERRED EMBODIMENT

Figure 1:
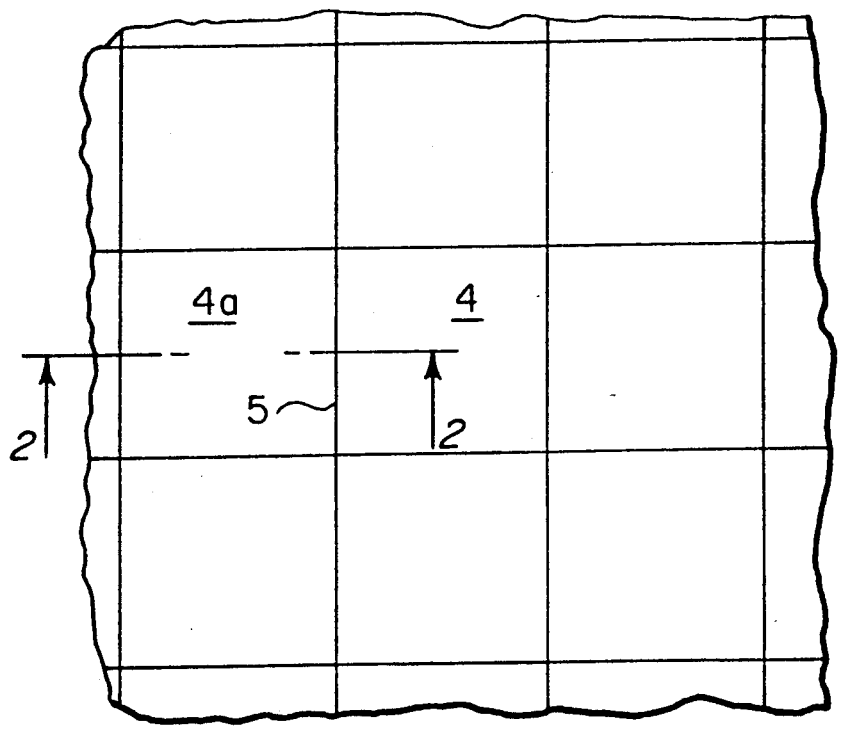
FIG. 1 is a plan view of a portion of a semiconductor substrate showing an arrangement of cells used in a prior art FET controlled thyristor.
Figure 2:
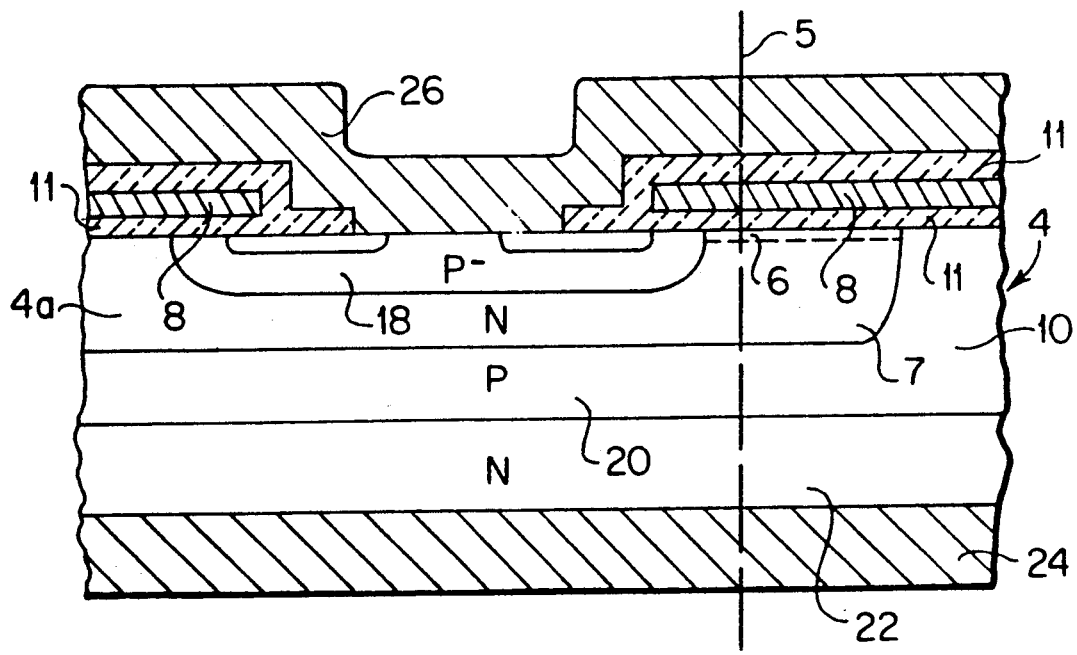
FIG. 2 is a cross-section, but to a different scale, of the thyristor shown in FIG. 1 along line 2—2 thereof.

FIGS. 1 and 2 show a prior art arrangement of a multi-cellular MCT comprising a repetitive pattern of blocks of 9 cells. In FIGS. 1 and 2, the boundary between the central cell 4 and the cell 4a to its left is indicated by the line 5. As previously noted, the central cell 4 of each block contains a turn-on FET, but not a turn-off FET. The turn-on FET is shown in FIG. 2 and comprises a channel region 6 at the surface of the base region 7 and an overlying insulated gate electrode 8. The gate electrode 8 is separated from the surface of the semiconductor substrate 10 by an insulating layer 11 which also overlies the gate electrode 8. The thyristor part of the cell 4a comprises a p type emitter region 18, the n type base region 7, a p type base region 20, and an n type emitter region 22. A cathode electrode 24 contacts the n emitter 22 and an anode electrode 26 contacts the p emitter 18. The anode electrode 26 extends over the gate electrode 8 and is insulated therefrom by the layer 11. Normally, for high charge carrier density injection from the p emitter 18 into the n base 7 during the on state operation of the thyristor, the p emitter 18 is highly doped (P+). However, as previously explained, because the central cell 4 contains no turn-off FET, whereby turn-off requires diversion of current therethrough to an adjacent cell 4a, the p emitter 18 of the adjacent cell 4a is only lightly doped (P−) to deliberately reduce the amount of current flowing through the cell 4a so as to accommodate the turn-off current from the central cell. This deliberate reduction of efficiency of the cells 4a is wasteful of space.

Figure 3:
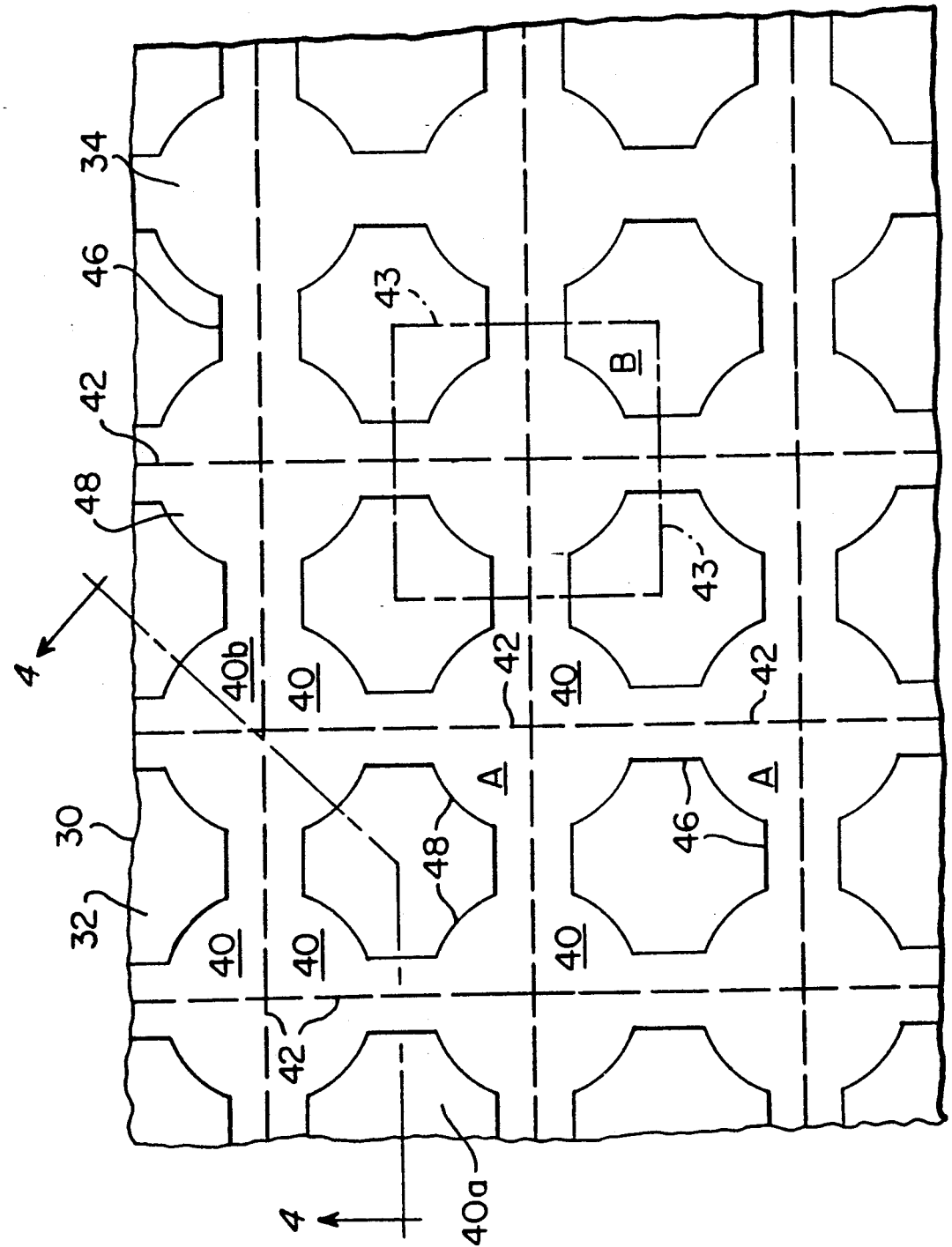
FIG. 3 is a view similar to that of FIG. 1, but showing a cell arrangement according to the present invention.
Figure 4:
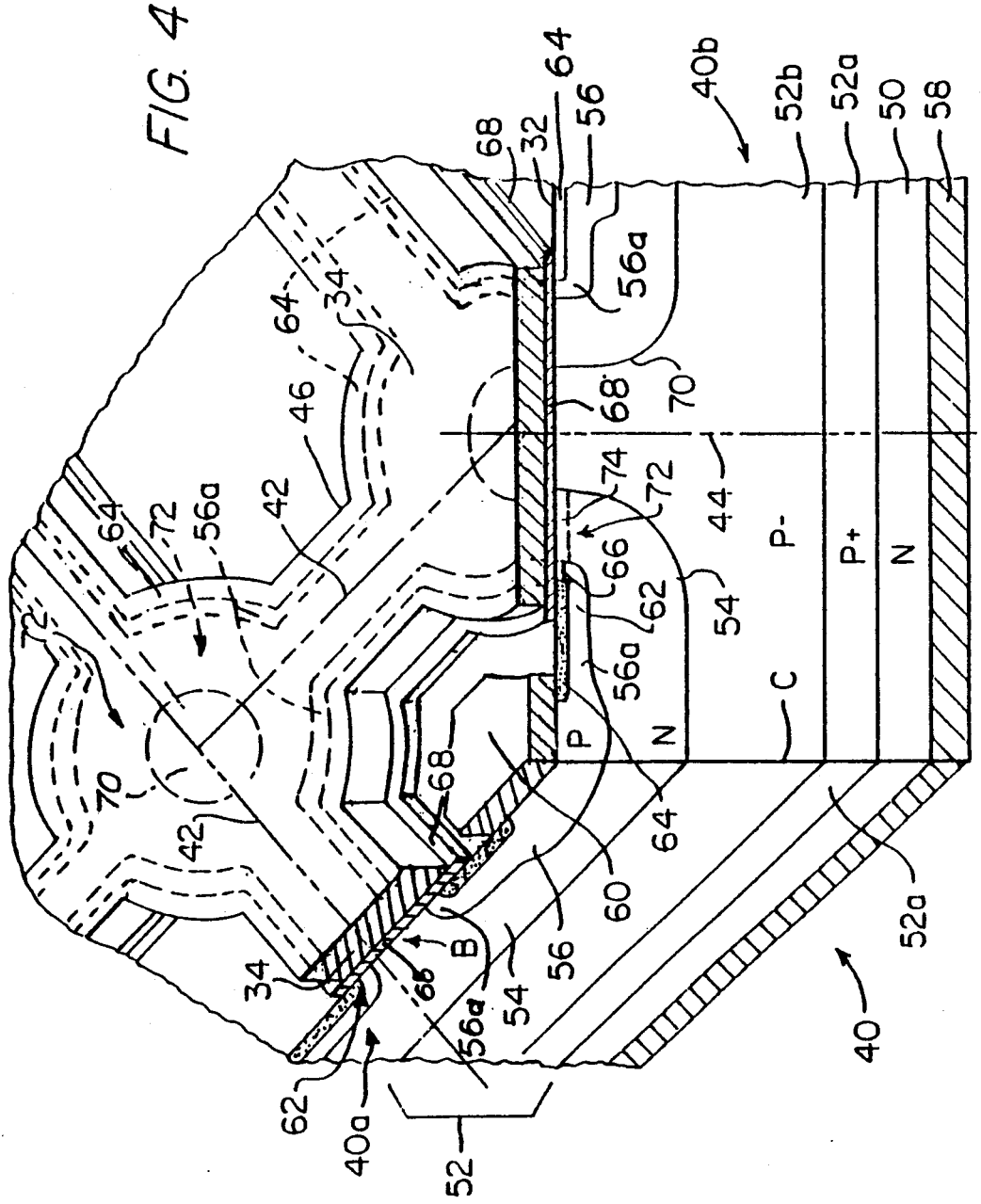
FIG. 4 is a perspective view of a portion of the thyristor shown in FIG. 3 cut away along the line 4—4 of FIG. 3, but to a different scale.

A thyristor arrangement according to the invention is shown in FIGS. 3 and 4 FIG. 3 is a plan view of a portion of the top surface of a semiconductor substrate 30 (e.g., of silicon) containing a plurality of thyristor cells connected in parallel to provide a composite thyristor. What is actually illustrated in FIG. 3 is the top surface 32 of the substrate and a grid-like pattern 34 of a conductive material, e.g., doped polycrystalline silicon, overlying both the turn-on and turn-off FETs of the various cells and serving as the gate electrodes of the FETs.

The composite thyristor contains a repetitive pattern of features defining (as described hereinafter) various portions of thyristor cells, e.g., vertical, main terminal current carrying paths and turn-on and turn-off FETs. Because of the repetitive nature of the pattern, it is possible to define a single cell in different ways. For example, in FIG. 3, a different square cell A or B can be identified depending upon where the cell sides, indicated by dashed lines 42 and 43, respectively, are placed. The composite thyristor can then be considered as comprising either a plurality of A cells, or a plurality of B cells, etc. However, regardless of how the individual cells of the composite thyristor are defined, all the complete cells (i.e., excepting possible partial cells at edges of the semiconductor substrate) are identical and have identical operating characteristics.

For purposes of the present description, the composite thyristor indicated in FIG. 3 is arbitrarily defined as comprising a plurality of identical cells 40 (i.e., the cell A) each defined by a square pattern of dashed lines 42 which identify four sides and four corners at the intersections of pairs of sides. Both the sides and corners are overlaid by the pattern 34 which comprises strips 46 overlying sides of adjacent cells and circular discs 48 each overlying the corners of four adjacent cells.

In this embodiment, the cells are of square shape. Other shapes, e.g., hexagonal, are possible. With hexagonal cells, only three cells meet at the cell corners.

FIG. 4 shows two cross-sections of the cell 40, one from the center C of the cell leftwardly to one side 42 thereof, and showing a portion of an adjacent cell 40a, and the other cross-section being from the center C rightwardly to a corner 44 of the cell and showing a portion of another adjacent cell 40b.

The cell 40 is "vertical" thyristor and comprises the usual four layers of a thyristor, namely, in this embodiment, a lowermost n type emitter layer 50 which is common to all the cells in the substrate; a p type base layer 52 including, for asymmetric blocking thyristors, a lowermost portion 52a of P+ conductivity and an overlying portion 52b of P− conductivity, the p type base layer 52 also being common to all the cells; an n type base layer 54; and an upper p type emitter layer 56. In a symmetric device there is no P+ region 52a. A conductive metal, e.g., aluminum, is ohmically bonded to the lower surface of the n type layer 50 and comprises the cathode electrode 58 of the composite thyristor. An anode electrode 60 is ohmically bonded to the upper surface of the p type layer 56. The anode electrode is common to all the cells and actually extends over the grid-like pattern 34 and is insulated therefrom by an intervening insulating layer similar to the insulating layer 11 shown in FIG. 2. The extension of the anode electrode over the gate electrode pattern 34 and the insulating layer overlying the gate electrode pattern 34 are not shown to simplify the drawing.

In the on, conductive state, current flows vertically through each cell between the emitter layers 50 and 56 through the intervening base layers 52 and 54.

Turn-on and turn-off control FETs are provided, in this embodiment, at the upper surface of the substrate within each cell. The FETs are of generally known type and function in generally known fashion to control the turn on and turn off of each thyristor cell (see, for example, U.S. Pat. No. 4,816,892 which shows similar FETs, but wherein the turn-off FET is disposed on the cathode side of the device, and the turn-on FET is disposed on the anode side.)

As shown in FIG. 4 herein, the turn-off FET 62 comprises an n type region 64 within the p type emitter 56 which serves as the source region of the FET. The anode electrode 60 contacts the region 64 and serves as the source electrode for the FET. The channel 66 of the FET 62 extends through the p type layer 56 at the surface thereof to the n type layer 54 which serves as the drain region of the turn-off FET. To serve this purpose, the n type base layer 54 extends upwardly around the p type emitter layer 56 to the surface of the substrate. The gate electrode for the turn-off FET comprises that portion of the conductive pattern 34 which overlies the source 64, channel 66, and drain regions of the FET, and which is insulated from these regions by an intervening layer 68 of insulating material. As indicated in FIG. 4, the turn-off FET 62 is a continuous structure which extends entirely around the cell. Along the sides 42 of the cell (but not at the cell corners), e.g., as illustrated to the left of the cell 40 in FIG. 4, the turn-off FETs 62 border corresponding FETs 62 of the adjacent cells, and the drain regions 54 (the common n base region 54) of the turn-off FETs of adjacent cells are common to one another.

Along the sides of the cells, as shown to the left of the center line C of FIG. 4, the p type base layer 52 is separated from the substrate upper surface 32 by the n type base layer 54. At the corners 44 of the cells, however, as shown towards the right of FIG. 4, a solid, circular cylinder 70 of the p type base layer 52b extends upwardly through the n type base layer 54 to the substrate surface. The surface portion of the p type cylinder 70 serves as the drain region of the turn-on FET 72.

The turn-on FET 72 for the cells comprises an upper portion 56a of the p type emitter layer 56 serving as the source region of the turn-on FETs, a channel region 74 extending through the upper surface portion of the n type base layer 54 to the aforementioned drain region 70, and the portions of the conductive pattern 34 overlying the source 56a, channel 74 and drain 70 regions.

Because the p type cylinders 70 are disposed only at the corners of the cells, the turn-on FETs are similarly disposed only at the cell corners. The turn-on FETs 72 at another one of the four corners of the cell 40 is shown at the upper left of FIG. 4.

The operation of the composite thyristor, made-up of the various parallel-connected cells, is not different from the prior art devices. Thus, with a positive voltage applied to the anode electrode 60 and a negative voltage applied the cathode electrode 58, the thyristor can be turned on by applying a negative voltage to the gate electrode 34. The gate electrode overlies the channels of both the turn-on and turn-off FETs, but, in this embodiment, with the FETs disposed on the anode side of the substrate, the negative gate electrode voltage serves to turn on the turn-on FETs 72 while biasing off the turn-off FETs 62. Charge carriers thus pass from the anode electrode 60 into the p emitter 56 and thence directly into the p base 52 via the on channel 74 of the turned on FET 72. As known, this serves to turn on the thyristor.

To turn off the thyristor, a positive voltage is applied to the gate electrode 34 which serves to turn on the turn-off FET 62 while biasing off the turn-on FET 72. According, charge carriers within the n base 54, instead of passing vertically upward to the p emitter region 56, are diverted laterally around the p emitter via the low resistance channel 66 of the FET 62 to the n source region 66 and thence to the anode electrode 60. As known, this serves to turn off the thyristor.

The advantages of the present invention result from the configuration of the composite thyristors, wherein, in contrast with the composite thyristor shown in FIGS. 1 and 2, each cell contains both turn-on and turn-off FETs, and no single cell is devoted primarily to the function of turning on other cells. In a comparison of the thyristors made according to the prior art, as shown in FIGS. 1 and 2, and thyristors made according to the invention, all the thyristors being made with comparable cell dimensions (cells per cm$^2$) and identical design rules, it is found that the current capacity of the turn-off FETs of the inventive thyristors is slightly reduced (e.g., by 14% in one comparison), whereas the current carrying capacity of the turn-on FETs of the inventive thyristors is increased by a factor of almost 10, resulting in a composite thyristor having a far faster turn on speed. Also, because all the cells are identical, similar current densities are present in all the cells and all the cells can be fully driven for maximum power capacity of the composite thyristor.

As previously noted, the repetitive pattern of the composite thyristor allows the individual cells to be differently defined. Thus, with the cell 40 defined as herein shown, the corners 44 of the cells each contain a turn-on FET 72 which has a common drain region 70 with three adjacent cells. Conversely, if the thyristor cells are defined as are the B cells in FIG. 3, the turn-on FET 72 of each cell is at the center of each cell.

Regardless of how the cells are defined, however, common to all cell configurations is the gate electrode grid pattern 34 comprising strips 46 which intersect at corners 48 (the circular discs in this embodiment). The turn-off FETs 62 are disposed beneath the gate electrode strips 46 while the turn-on FETs 72 are disposed only beneath the gate electrode corners 48.

What is claimed is:

1. A thyristor comprising a plurality of contiguous thyristor cells disposed in a semiconductor substrate having first and second oppositely disposed surfaces, each of said cells comprising, in the named order and between said first and second surfaces, only a single first emitter region, a first base region, a second base region, and a second emitter region, adjacent ones of said regions being of opposite conductivity type, said first base region having a portion extending, in surrounding relation with said first emitter region, to said first surface, and said second base region having a portion extending alongside said first base region portion to said first surface, each said cell having sides each of which is common to a contiguous cell, all the sides of each cell meeting at corners each of which is common to at least two contiguous cells, each of said cells including a turn-on FET and a turn-off FET each including a channel region disposed at said first surface, an insulated gate electrode overlying said channel region, and source and drain regions, the source region of said turn-off FET comprising a third region embedded in said first emitter region, said third region being of a conductivity type opposite to that of said first emitter region and separated by a portion of said first emitter region from said portion of said first base region, said portion of said first emitter region comprising said channel region of said turn-off FET and said portion of said first base region comprising said drain region of said turn-off FET, and the source, channel and drain regions of said turn-on FET comprising said portion of said first emitter region, said portion of said first base region, and said portion of said second base region, respectively, and all of said corners including a turn-on FET sharing a common drain region with a contiguous cell at each said corner.

2. A thyristor comprising a plurality of contiguous thyristor cells disposed in a semiconductor substrate having first and second oppositely disposed surfaces, each of said cells comprising, in the named order and between said first and second surfaces, only a single first emitter region, a first base region, a second base region, and a second emitter region, adjacent ones of said regions being of opposite conductivity type, said first base region having a portion extending, in surrounding relation with said first emitter region, to said first surface, and said second base region having a portion extending alongside said first base region portion to said first surface, each said cell having sides each of which is common to a contiguous cell, the sides of each cell meeting at corners each of which is common to at least two contiguous cells, each of said cells including a turn-on FET and a turn-off FET each including a channel region disposed at said first surface, an insulated gate electrode overlying said channel region, and source and drain regions, the source region of said turn-off FET comprising a third region embedded in said first emitter region, said third region being of a conductivity type opposite to that of said first emitter region and separated by a portion of said first emitter region from said portion of said first base region, said portion of said first emitter region comprising said channel region of said turn-off FET and said portion of said first base region comprising said drain region of said turn-off FET, and the source, channel and drain regions of said turn-on FET comprising said portion of said first emitter region, said portion of said first base region, and said portion of said second base region, respectively, a conductive material pattern overlying all said FETs and comprising the gate electrodes thereof, said pattern comprising strips which intersect at corners, said turn-off FETs being disposed beneath said strips, and all of said corners overlying a turn-on FET.

3. A thyristor according to claim 1 wherein all of said cells are identical.

4. A thyristor according to claim 3 wherein said first emitter region forms a p-n junction with said first base region and said first emitter region is highly doped with the exception of said portion of said first emitter region which is lightly doped.

5. A thyristor according to claim 2 wherein said corners of said conductive material pattern are disposed at corners of said cells, and each conductive material pattern corner forms the gate electrode of the turn-off FET of at least two cells having a common border underlying said each pattern corner.

6. A thyristor according to claim 5 wherein said conductive material pattern corners have a generally circular shape.

7. A thyristor according to claim 5 wherein the portion of said conductive pattern at each cell is generally annular and disposed around the periphery of the cell, an opening being provided through said pattern portion, and an electrode disposed within said opening and contacting an emitter region at a surface of said substrate.

8. A thyristor according to claim 2 wherein said pattern corners are disposed generally centrally within said cells.

9. A thyristor according to claim 2 wherein all of said cells are identical.

10. A thyristor according to claim 9 wherein said first emitter region forms a p-n junction with said first base region and said first emitter region is highly doped with the exception of said portion of said first emitter region which is lightly doped.

* * * * *

UNITED STATES PATENT AND TRADEMARK OFFICE
CERTIFICATE OF CORRECTION

PATENT NO. : 5,260,590
DATED : November 9, 1993
INVENTOR(S) : Victor A. K. Temple It is certified that error appears in the above-indentified patent and that said Letters Patent is hereby corrected as shown below:

On the title page, Item [75]:Inventors should read:

Victor A. K. Temple, Clifton Park; Stephen D. Arthur, Glenville; both of New York.

Signed and Sealed this

Twenty-first Day of June, 1994

Attest:

BRUCE LEHMAN

*Attesting Officer*     *Commissioner of Patents and Trademarks*